US011090619B2

(12) United States Patent
Matsushima et al.

(10) Patent No.: US 11,090,619 B2
(45) Date of Patent: Aug. 17, 2021

(54) EXHAUST SYSTEM AND EXHAUST METHOD

(71) Applicant: EBARA CORPORATION, Tokyo (JP)

(72) Inventors: Keisuke Matsushima, Tokyo (JP); Kazutomo Miyazaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/061,899

(22) Filed: Oct. 2, 2020

(65) Prior Publication Data

US 2021/0106955 A1 Apr. 15, 2021

(30) Foreign Application Priority Data

Oct. 10, 2019 (JP) .............................. JP2019-186629

(51) Int. Cl.
*B01F 3/02* (2006.01)
*G03F 7/20* (2006.01)
*G05D 11/02* (2006.01)

(52) U.S. Cl.
CPC .......... *B01F 3/026* (2013.01); *G03F 7/70858* (2013.01); *G05D 11/02* (2013.01)

(58) Field of Classification Search
CPC .. B01F 3/026; G03F 7/70858; G03F 7/70908; G03F 7/70933; G03F 7/70991; G05D 11/02
USPC ............................................. 355/30, 67, 77
See application file for complete search history.

(56) References Cited

U.S. PATENT DOCUMENTS

| 2011/0192139 | A1 | 8/2011 | Paik |
| 2019/0041058 | A1* | 2/2019 | Miyazaki .................. F23G 5/24 |
| 2019/0289705 | A1 | 9/2019 | Ishihara et al. |

FOREIGN PATENT DOCUMENTS

| CN | 109004252 A | 12/2018 |
| JP | H05-115753 A | 5/1993 |
| JP | H11-47550 A | 2/1999 |
| KR | 10-0778566 B1 | 11/2007 |

OTHER PUBLICATIONS

Dutch Search Report dated Apr. 16, 2021 in Dutch Patent Application No. 2026632.

* cited by examiner

*Primary Examiner* — Colin W Kreutzer
(74) *Attorney, Agent, or Firm* — Pearne & Gordon LLP

(57) ABSTRACT

An exhaust system capable of diluting a hydrogen gas to a concentration below the lower explosive limit without requiring a large amount of dilution gas while preventing an increase in a pressure of an exhaust gas in a buffer tank is disclosed. The exhaust system performs, when a main valve disposed in an exhaust line is closed, an initial exhaust operation in which a gas heavier than the hydrogen gas is discharged from a lower part of a buffer tank while an inlet valve disposed in an inlet line and a first outlet valve disposed in an outlet line are opened to introduce the exhaust gas from an equipment in a tangential direction of a buffer tank. Next, the exhaust system performs a hydrogen-gas discharge operation in which the inlet valve and the first outlet valve are closed, and the a bypass valve disposed in a bypass line and the second outlet valve disposed in a hydrogen-gas discharge line are opened to discharge the hydrogen gas stayed in an upper part of the buffer tank while flowing the exhaust gas into a bypass line.

9 Claims, 12 Drawing Sheets

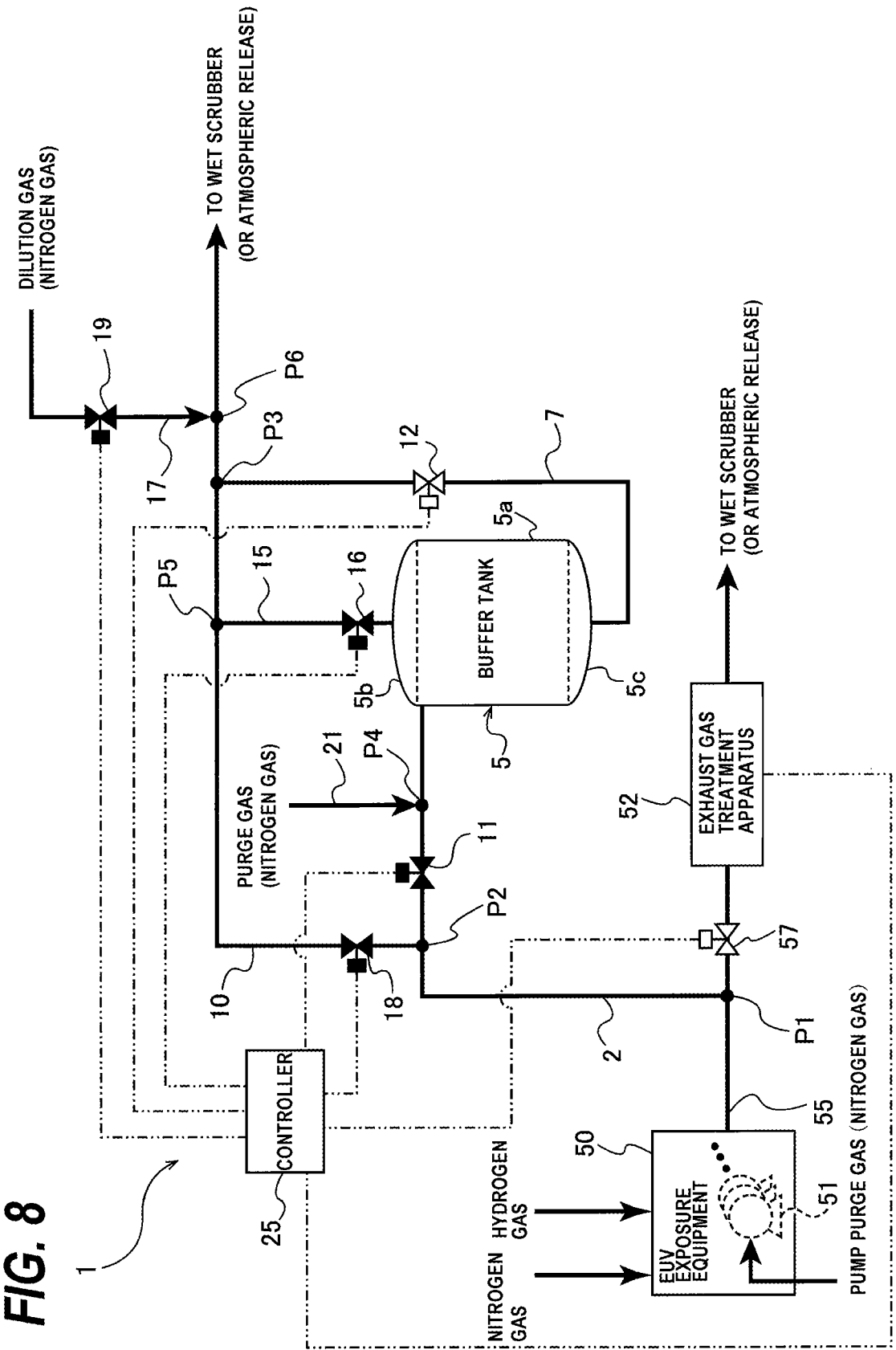

EXHAUST SYSTEM AND EXHAUST METHOD

CROSS REFERENCE TO RELATED APPLICATION

This document claims priority to Japanese Patent Application Number 2019-186629 filed Oct. 10, 2019, the entire contents of which are hereby incorporated by reference.

BACKGROUND

Hydrogen gas has advantages that it has a high energy efficiency and does not emit greenhouse gases (e.g., carbon dioxide) when used, and thus is widely used in various industrial fields (e.g., oil refining, semiconductor manufacturing, metal manufacturing, glass manufacturing, and food manufacturing). Furthermore, in the future, there is a possibility that a so-called "hydrogen energy society" will be built, in which hydrogen gas will be used as a main energy source to replace fossil fuels such as petroleum. In order to realize the hydrogen energy society where a large amount of hydrogen gas are consumed, a large number of hydrogen gas related facilities, such as hydrogen gas production plant, hydrogen gas storage plant, and hydrogen gas filling station, will be required.

Further, in recent years, an EUV (Extreme Ultra Violet) exposure equipment, in which a substrate, such as wafer, can be exposed at a short wavelength of 13.5 nm, is being put to practical use. The exposure equipment is a super-precision equipment, and particularly performance of the EUV exposure equipment is drastically lowered by entry of a foreign matter into the optical system. The EUV exposure equipment includes a light source unit for emitting an EUV, and an exposure unit for exposing substrates with the EUV emitted from the light source unit. It is known that oxide of tin (Sn) produced by irradiation of laser onto a target in the light source unit and organic material separated from light-sensitive material (resist) in the exposure unit are typical contamination sources.

As a measure against these contamination sources, there is a method of using a hydrogen gas. The oxide of tin is removed as gaseous hydride by using the hydrogen gas at a rate of several hundred liters per minute (L/min) in the light source unit, and the organic material is gasified and removed by using the hydrogen gas at a rate of several dozen liters per minute (L/min) in the exposure unit. Although the used hydrogen gas is mostly unreacted, such hydrogen gas is discharged from the apparatus as a carrier of the removed contaminant. In this case, the discharged hydrogen gas varies greatly in amount depending on the presence of operation process for evacuating the exposure unit to produce a vacuum therein, independent operation of the light source unit and the exposure unit, respectively, at some level, or periodic maintenance. Therefore, an exhaust gas containing a large amount of hydrogen gas having a rate of several hundred liters/minute is discharged from the EUV exposure equipment.

As an apparatus for treating exhaust gas discharged from the EUV exposure equipment, a combustion-type exhaust gas treatment apparatus has been studied, in which the exhaust gas is brought into contact with a flame to perform combustion treatment. The exhaust gas discharged from the EUV exposure equipment contains a large amount of hydrogen gas, and thus the combustion treatment of exhaust gas can be performed only by supplying the oxidizing gas (oxygen-containing gas, such as air) without supplying the fuel. Therefore, the combustion-type exhaust gas treatment apparatus is expected to be installed downstream of the EUV exposure equipment to combust hydrogen gas at a low cost.

Hydrogen gas, which is used in various technical fields, is a highly reactive substance and also has a feature of having a large amount of heat per unit mass. Therefore, a large-scale fire may occur, if a failure occurs in a facility, such as a hydrogen production plant, a hydrogen gas filling station, and a combustion-type exhaust gas treatment apparatus, which handles a large amount of hydrogen gas and a large amount of hydrogen gas is released into the atmosphere. For example, if a failure, such as a fire loss, occurs in the combustion-type exhaust gas treatment apparatus that is burning the exhaust gas containing a large amount of hydrogen gas and thus the combustion-type exhaust gas treatment apparatus is shut down, a large amount of hydrogen gas is released into the atmosphere without combustion. In this case, the hydrogen gas mixed with the oxygen in the air may ignite and cause a fire in the factory where the exhaust gas treatment apparatus is installed.

Accordingly, an exhaust system has been conventionally used, in which, when a failure occurs in a facility that handles a large amount of hydrogen gas, hydrogen gas is diluted with a diluted gas (e.g., an inert gas, such as nitrogen gas) to a concentration below the lower explosive limit (also called the lower flammability limit) and then discharged into the atmosphere. In this specification, gas containing hydrogen gas to be treated by the exhaust system is collectively referred to as "exhaust gas". Hydrogen gas is not toxic in itself, so that hydrogen gas can be safely released into the atmosphere if its concentration is reduced below the lower explosive limit.

A conventional exhaust system includes, for example, a buffer tank that emergently receive the exhaust gas containing a large amount of hydrogen gas, an exhaust line connected to the buffer tank, and a flow controller (e.g., an orifice, a needle valve, or a mass flow controller) disposed in the exhaust line. When a failure occurs in the facility treating a large amount of hydrogen gas, the exhaust gas containing a large amount of hydrogen gas is introduced into the buffer tank, and then the exhaust gas stored in the buffer tank is discharged into the exhaust line while limiting the flow rate to a predetermined flow rate by use of the flow controller. Further, the exhaust gas flowing through the exhaust line is mixed with a dilution gas, thereby reducing the concentration of hydrogen gas contained in the exhaust gas below the lower explosive limit and being released into the atmosphere. If a low-cost inert gas, such as nitrogen gas, is used as the dilution gas, a large amount of hydrogen gas can be safely released into the atmosphere at a relatively low cost.

However, if a large amount of exhaust gas is introduced into the buffer tank while limiting the flow rate of the exhaust gas in the exhaust line by use of the flow controller, the pressure of the exhaust gas in the buffer tank is increased. In this case, an excessive back-pressure may be applied to the equipment located upstream of the buffer tank. For example, an excessive back-pressure is applied to the dry pump of the EUV exposure equipment located upstream of the buffer tank, causing the dry pump to be stopped. When the dry pump stops, the air may enter into the light source unit and the exposure unit of the EUV exposure equipment, causing the light source unit and the exposure unit to be contaminated. In this case, EUV exposure equipment would be shut down for a long time.

An example of a measure to suppress the increase in pressure of the exhaust gas in the buffer tank is to provide a huge buffer tank that is large enough for the flow rate of the exhaust gas introduced into the buffer tank. However, considering the current state of the industry where a footprint of the equipment is constantly required to be reduced, it is difficult to install a huge buffer tank in the exhaust system.

Another example of a measure to suppress the increase in pressure of the exhaust gas in the buffer tank is to omit the flow controller and match the flow rate of the exhaust gas discharged from the buffer tank with the flow rate of the exhaust gas introduced into the buffer tank. However, in this case, the flow rate of the dilution gas, which dilutes the hydrogen gas contained in the exhaust gas to the concentration below the lower explosive limit, is also increased. Specifically, a large amount of dilution gas is required to treat the hydrogen gas, and as a result, there is a concern that the treating cost of the hydrogen gas will increase.

SUMMARY OF THE INVENTION

Therefore, there are provided an exhaust system and an exhaust method capable of diluting hydrogen gas to a concentration below the lower explosive limit without requiring a large amount of dilution gas while preventing an increase in a pressure of an exhaust gas in a buffer tank.

Embodiments, which will be described below, relate to an exhaust system and an exhaust method for diluting hydrogen gas to a concentration below its lower explosive limit and releasing it into the atmosphere, and particularly relate to an exhaust system and an exhaust method for urgently diluting hydrogen gas to a concentration below its lower explosive limit and releasing it into the atmosphere in the event of a shutdown of an exhaust gas treatment apparatus in which a large amount of hydrogen gas is treated.

The present inventors have thoroughly researched an exhaust system capable of diluting a large amount of hydrogen gas contained in the exhaust gas to a concentration below the lower explosive limit, and as a result, have obtained the following findings, thereby completing the present invention. Specifically, it has found that, when a mixed gas, containing hydrogen gas and a gas heavier than hydrogen gas (for example, nitrogen gas), are introduced at an upper part of a buffer tank having a cylindrical portion and in a tangential direction of an inner peripheral surface of the buffer tank, the hydrogen gas remains in an upper part of the buffer tank and only the gas heavier than the hydrogen gas moves (diffuses) toward a bottom of the buffer tank. Further, the present inventors have found that discharge lines for discharging the exhaust gas in the buffer tank are provided at the lower part and the upper part of the buffer tank, respectively, and opening/closing operations of valves provided in each discharge line is appropriately controlled, enabling the hydrogen gas and the gas heavier than the hydrogen gas to be selectively discharged from the buffer tank.

Based on the above findings, in an embodiment, there is provided an exhaust system connected to an exhaust line in which an exhaust gas containing a hydrogen gas is flown, comprising: an inlet line which is branched from the exhaust line, and in which an inlet valve is disposed; a buffer tank which is coupled to the inlet line and has a cylindrical-shaped portion; an outlet line which is coupled to a lower part of the buffer tank and in which a first outlet valve is disposed; a bypass line which couples the inlet line to the outlet line and in which a bypass valve is disposed; a hydrogen-gas discharge line which extends from an upper part of the buffer tank to the bypass line or the outlet line and in which a second outlet valve is disposed; a purge line for supplying a purge gas into the buffer tank; a dilution gas line which is coupled to the outlet line and in which a dilution-gas introduction valve is disposed; and a controller for controlling operations of the inlet valve, the first outlet valve, the second outlet valve, and the dilution-gas introduction valve, wherein the inlet line is coupled to an upper part of the cylindrical-shaped portion so as to introduce the exhaust gas toward a tangential direction of the buffer tank, the controller is configured to perform, when a main valve disposed in the exhaust line is closed, an initial exhaust operation which opens at least the inlet valve and the first outlet valve, and perform, after performing the initial exhaust operation for a predetermined time, a hydrogen-gas discharge operation which closes the inlet valve and the first outlet valve, and opens the bypass valve, the second outlet valve, and the dilution-gas introduction valve.

In an embodiment, a guide plate extending in a spiral form is disposed in an inner peripheral surface of the buffer tank.

In an embodiment, the cylindrical-shaped portion of the buffer tank is formed as a truncated cone shape having a diameter which gradually increases from a top end toward a bottom end thereof.

In an embodiment, the controller further opens the dilution-gas introduction valve during the initial exhaust operation.

In an embodiment, the exhaust gas is an exhaust gas discharged from EUV exposure equipment.

In an embodiment, there is provided a method of diluting and discharging hydrogen gas, contained in an exhaust gas flowing in an exhaust line in which a main valve is disposed, to a concentration below a lower explosive limit, comprising: performing, when the main valve is closed, an initial exhaust operation in which a gas heavier than the hydrogen gas contained in the exhaust gas is discharged from a lower part of the buffer tank while the exhaust gas flowing in the exhaust line is introduced in a tangential direction of a buffer tank to form a swirling flow of the exhaust gas in the buffer tank; and performing, after performing the initial exhaust operation for a predetermined time, a hydrogen-gas exhaust operation in which the hydrogen gas is discharged from an upper part of the buffer tank in accordance with a flow rate of purge gas supplied to the buffer tank through a purge gas line.

In an embodiment, the initial exhaust operation is an operation in which an inlet valve disposed in an inlet line that is branched from the exhaust line, and the first outlet valve disposed in an outlet line that is coupled to a lower part of the buffer tank are opened, and the hydrogen-gas exhaust operation is an operation in which the inlet valve and the first outlet valve are closed, and a bypass valve disposed in a bypass line that couples the inlet line to the outlet line, a second outlet valve disposed in a hydrogen-gas discharge line that extends from an upper part of the buffer tank to the bypass line or the outlet line, and a dilution-gas introduction valve disposed in a dilution-gas line which is coupled to the outlet line are opened.

In an embodiment, the dilution-gas introduction valve is further opened during the initial exhaust operation.

In an embodiment, the exhaust gas is an exhaust gas discharged from EUV exposure equipment.

According to the above-described embodiments, the hydrogen gas containing the exhaust gas which is introduced into the buffer tank during the initial exhaust operation, is stayed in the upper part of the buffer tank, and a gas (i.e., nitrogen gas) heavier than the hydrogen gas is discharged from the lower part of the buffer tank. On the other hand, the hydrogen gas stayed in the upper part of the buffer tank is discharged from the outlet line through the hydrogen-gas discharge line in accordance with a flow rate of the purge gas supplied from the purge line by the hydrogen-gas exhaust operation performed after the initial exhaust operation. Therefore, a flow rate of the dilution gas supplied from the dilution line may be an amount sufficient to dilute an amount of the hydrogen gas corresponding to the flow rate of the purge gas to a concentration below the lower explosive limit, and as a result, the amount of the dilution gas is significantly reduced.

Further, according to the above-described embodiments, it is unnecessary to provide device (e.g., a flow controller installed in a conventional exhaust system) that inhibits the flow of the exhaust gas discharged from the buffer tank, in the outlet line, preventing an excessive back-pressure from being applied to the device located upstream of the buffer tank.

BRIEF DESCRIPTION OF THE DRAWINGS

FIG. 8 is a view showing opened/closed states of a plurality of valves of the exhaust system during normal operation of the exhaust gas treatment apparatus;

DESCRIPTION OF EMBODIMENTS

Embodiments will be described with reference to the drawings.

Figure 1:
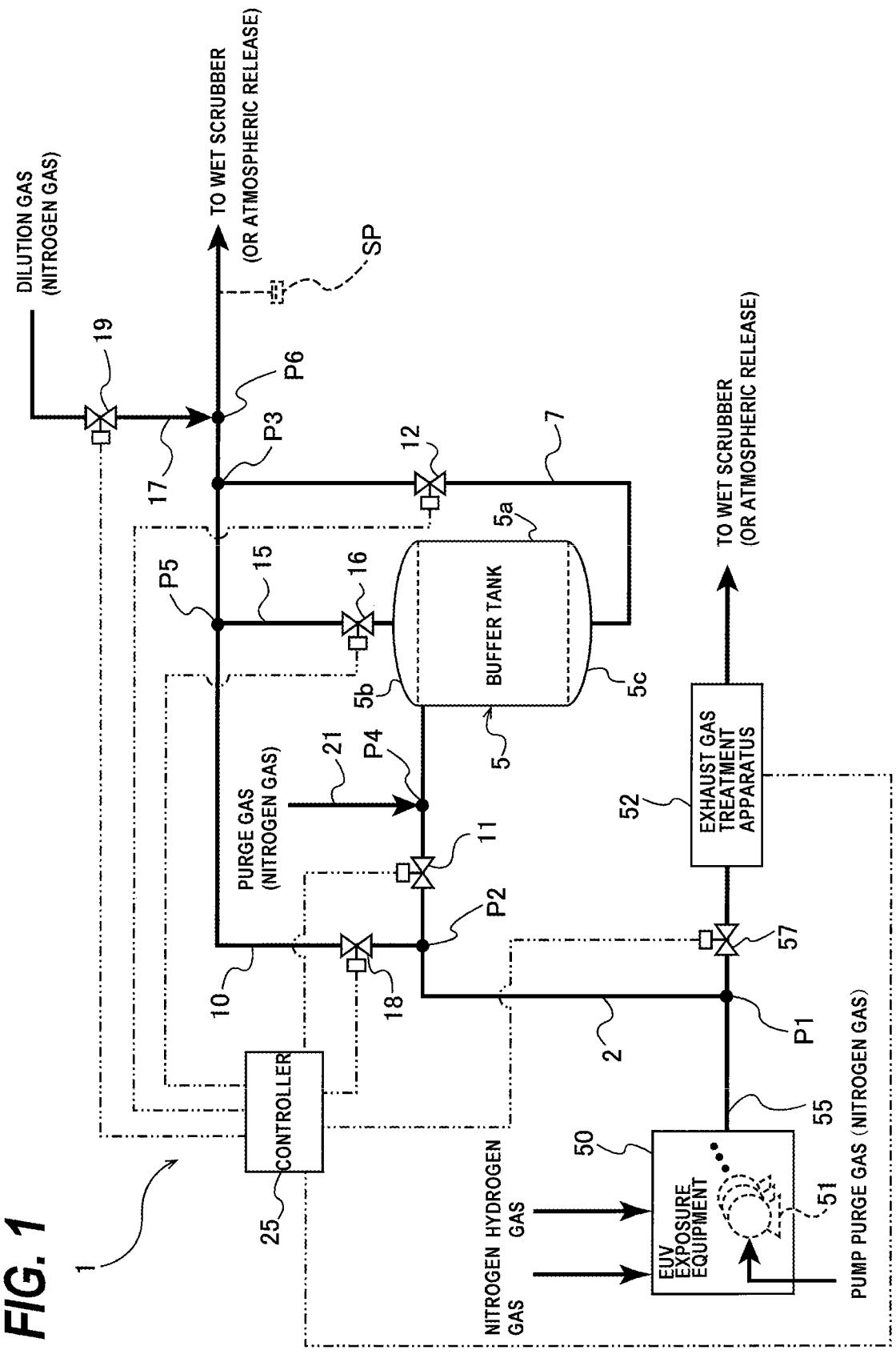
FIG. 1 is a schematic view showing an exhaust system according to an embodiment.

FIG. 1 is a schematic view showing an exhaust system according to an embodiment. This exhaust system 1 is a system for diluting a large amount of hydrogen gas contained in an exhaust gas to a concentration below the lower explosive limit (4%) and releasing it into the atmosphere. In the example shown in FIG. 1, the exhaust system 1 serves as an emergency exhaust system that dilutes a large amount of hydrogen gas contained in the exhaust gas to a concentration below the lower explosive limit capable of releasing it to the atmosphere when an exhaust gas treatment apparatus 52, which treats the exhaust gas discharged from the EUV exposure equipment 50, is shut down. However, the present invention is not limited to the example shown in FIG. 1. For example, the exhaust system 1 may be installed in a facility, such as a hydrogen production plant, a hydrogen gas storage plant, and a hydrogen gas filling station, which handles a large amount of hydrogen gas that handle large quantities of hydrogen gas. In this case, when the large amount of hydrogen gas is discharged from the facility, the exhaust system 1 is used to dilute the hydrogen gas to a concentration below the lower explosive limit before it is released into the atmosphere.

As shown in FIG. 1, a hydrogen gas and a base gas (nitrogen gas) are supplied to the EUV exposure equipment 50. The base gas is a gas heavier than the hydrogen gas (i.e., having a greater specific gravity than the hydrogen gas). In this embodiment, the base gas is nitrogen gas. The EUV exposure equipment 50 includes a light source unit (not shown) for emitting an EUV, and an exposure unit for exposing substrates, such as wafers, with the EUV emitted from the light source unit, and a mixed gas of the hydrogen gas and the base gas is supplied to the light source unit and the exposure unit, respectively.

The mixed gas supplied to the light source unit includes, for example, the hydrogen gas having a flow rate of several hundred liters per minute, the hydrogen gas being used to remove oxide of tin generated in the light source unit as a gaseous hydride. The mixed gas supplied to the exposure unit includes, for example, hydrogen gas having a flow rate of several dozen liters per minute, the hydrogen gas being used to gasify and remove organic material generated in the exposure unit. The hydrogen gas supplied to the light source unit and the exposure unit of the EUV exposure equipment 50 is mostly unreacted, and therefore, the exhaust gas discharged from the EUV exposure equipment 50 contains a large amount of hydrogen gas.

Further, the EUV exposure equipment 50 includes a plurality of dry pumps 51 for evacuating the light source unit and the exposure unit to a vacuum. Nitrogen gas is also supplied to these dry pumps 51 as a pump purge gas. The exhaust gas including the hydrogen gas and the nitrogen gas (including the base gas and the pump purge gas), which is discharged from the EUV exposure equipment 50 by the dry pumps 51, is sent from the EUV exposure equipment 50 to the exhaust gas treatment apparatus 52 through the exhaust line 55. The exhaust line 55 extends from the EUV exposure equipment 50 to the exhaust gas treatment apparatus 52.

The exhaust gas treatment apparatus 52 is preferably a combustion-type exhaust gas treatment apparatus. The exhaust gas discharged from the EUV exposure equipment 50 contains a large amount of hydrogen gas. Therefore, the combustion treatment of exhaust gas can be performed only by supplying the oxidizing gas (oxygen-containing gas, such as air) without supplying the fuel. Therefore, the combustion-type exhaust gas treatment apparatus can perform combustion treatment of hydrogen gas simply by supplying a oxidizing gas (e.g., an oxygen-containing gas such as air) without separately supplying fuel. In this embodiment, a wet scrubber is provided downstream of the exhaust gas treatment apparatus 52, and the exhaust gas from which the hydrogen gas has been removed by the exhaust gas treatment apparatus 52 is sent to the wet scrubber. In one embodiment, the exhaust gas discharged from the exhaust gas treatment apparatus 52 may be directly released to the atmosphere without being sent to another apparatus, such as the wet scrubber.

If the exhaust gas treatment apparatus 52 is shut down due to a failure, such as a fire loss, the exhaust gas treatment apparatus 52 immediately transmits an error signal to the EUV exposure equipment 50. Upon receiving the error signal, the EUV exposure equipment 50 shuts off supplies of the hydrogen gas and the base gas (nitrogen gas) to the light source unit and the exposure unit after a predetermined delay time (e.g., 5 seconds after the error signal is received) is elapsed. The predetermined delay time is, for example, a time that is set to protect the light source disposed in the light source unit and the substrate in the exposure unit, and is stored in advance in a controller (not shown) of the EUV exposure equipment 50. Therefore, even if the exhaust gas treatment apparatus 52 is shut down, the exhaust gas containing the large amount of hydrogen gas, is discharged from the EUV exposure equipment 50 into the exhaust line 55 until the predetermined delay time has elapsed.

Furthermore, even after the supplies of hydrogen gas and nitrogen gas into the EUV exposure equipment 50 is shut off, the exhaust gas containing the large amount of hydrogen gas remains in the EUV exposure equipment 50 and the exhaust line 55. If the exhaust gas discharged from the EUV exposure equipment 50 until the predetermined delay time elapses, and the exhaust gas remaining in the EUV exposure equipment 50 and the exhaust lines 55 after the predetermined delay time has elapsed are released into the atmosphere as they are, a fire may occur in a factory where the EUV exposure equipment 50 is installed. Accordingly, when the exhaust gas treatment apparatus is shut down, the exhaust gas flowing in the exhaust line 55 is introduced into the exhaust system 1 to dilute the large amount of hydrogen gas contained in the exhaust gas to a concentration below the lower explosive limit that can be released to the atmosphere. The specific configuration of the exhaust system 1 will be described below.

The exhaust system 1 shown in FIG. 1 includes an inlet line 2 which branches from a middle of the exhaust line 55, a buffer tank 5 coupled to an end of the inlet line 2, an outlet line 7 coupled to a lower part of the buffer tank 5, a bypass line 10 which connects the inlet line 2 to the outlet line 7, a hydrogen-gas discharge line 15 extending from an upper portion of the buffer tank 5, and a dilution-gas line 17 coupled to the outlet line 7. The inlet line 2 branches from the exhaust line 55 at a branch point P1, and is coupled to the upper part of the buffer tank 5. A main valve 57 is disposed in the exhaust line 55, and the branch point P1 is provided upstream of the main valve 57 in the exhaust line 55. During operating of the exhaust gas treatment apparatus 52, the main valve 57 is opened, and the exhaust gas from the EUV exposure equipment 50 is sent through the exhaust line 55 to the exhaust gas treatment apparatus 52.

An inlet valve 11 is disposed in the inlet line 2, and a first outlet valve 12 is disposed in the outlet line 7. The outlet line 7 extends from the lower part of the buffer tank 5 to the above-mentioned wet scrubber. In one embodiment, an end of the outlet line 7 may be opened to the atmosphere to release the gas flowing through the outlet line 7 to the atmosphere. The bypass line 10 extends from a branch point P2 located upstream of the inlet valve 11 in the inlet line 2, and is connected to the outlet line 7 at a connection point P3 provided downstream of the first outlet valve 12. A bypass valve 18 is disposed in the bypass line 10.

The exhaust system 1 further includes a purge line 21 for supplying a purge gas to the buffer tank 5. In this embodiment, The purge gas is the same nitrogen gas as the base gas supplied to the EUV exposure apparatus 50. The purge line 21 shown in FIG. 1 is connected to the inlet line 2 at a connection point P4 provided in the inlet line 2, and this connection point P4 is located downstream of the inlet valve 11 in the inlet line 2. In this embodiment, the purge gas is constantly supplied from the purge line 21 to the buffer tank 5 through the inlet line 2, and the buffer tank 5 is filled with the purge gas.

The buffer tank 5 shown in FIG. 1 is constructed of a main body 5a having a cylindrical shape, an upper lid 5b which closes an upper opening of the main body 5a, and a lower lid 5c which closes a lower opening of the main body 5a. The main body 5a is a cylindrical-shaped portion of the buffer tank 5. The upper lid 5b has an upwardly convex dome-shape, and the lower lid 5c has a downwardly convex dome-shape. In one embodiment, the upper lid 5a and the lower lid 5b may have flat plate shape, respectively. In this embodiment, the upper lid 5a and the lower lid 5c are fixed to the upper and lower ends of the main body 5a by welding or the like. In one embodiment, the upper lid 5a and the lower lid 5c may be formed integrally with the main body 5a. The outlet line 7 extends from the lower part of the buffer tank 5. In this embodiment, the outlet line 7 extends from the lowermost end of the buffer tank 5, i.e., the center of the lower lid 5c.

The hydrogen gas discharge line 15 extends from the upper part of the buffer tank 5 to the bypass line 10. In this embodiment, the hydrogen gas discharge line 15 extends from the topmost end of the buffer tank 5, i.e., the center of the upper lid 5a to a connection point P5 provided in the bypass line 10. The connection point P5 is located downstream of the bypass valve 18 in the bypass line 10. A second outlet valve 16 is disposed in the hydrogen gas discharge line 15. In one embodiment, the hydrogen gas discharge line 15 may be connected to a downstream side of the first outlet valve 12 in the outlet line 7.

The dilution line 17 is coupled to the outlet line 7 at a connection point P6 provided downstream of the connection point P3. A dilution-gas introduction valve 19 is disposed in the dilution line 17. When the dilution-gas introduction valve 19 is opened, the dilution gas flowing in the dilution line 17 is introduced into the outlet line 7. In this embodiment, the dilution gas is also nitrogen gas, which is a relatively low-cost inert gas.

The exhaust system 1 further includes a controller 25 connected to the inlet valve 11, the first outlet valve 12, the second outlet valve 16, the bypass valve 18, and the dilution-gas introduction valve 19. The controller 25 is configured to be able to independently control the opening and closing operations of these valves 11, 12, 16, 18, and 19. In this embodiment, the controller 25 is also connected to the main valve 57 disposed in the exhaust line 55, and is configured to be able to control the opening and closing operation of the main valve 57. In one embodiment, the controller 25 may be configured to receive an open signal and/or a close signal of the main valve 57. In this case, the opening and closing operation of the main valve 57 is controlled by another controller (e.g., a controller of the exhaust gas treatment apparatus 52) different from the controller 25.

Further, the controller 25 is also connected to the exhaust gas treatment apparatus 52, and is configured to be able to receive an error signal emitted from the exhaust gas treatment apparatus 52. The exhaust gas treatment apparatus 52 generates an error signal when the exhaust gas treatment apparatus 52 is shut down due to a failure, such as a fire loss, for example, and transmits the error signal to the controller 25.

Figure 2A:
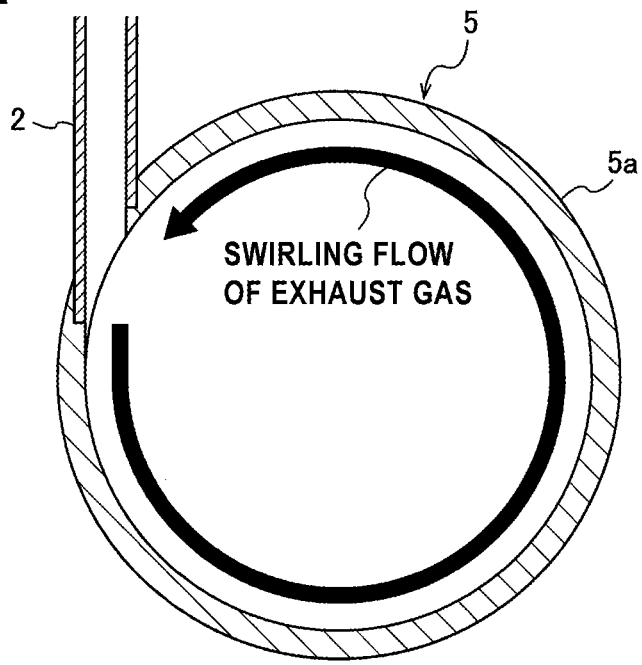
FIG. 2A is a schematic cross-sectional view showing a connecting portion between an inlet line and a main body of a buffer tank.
Figure 2B:
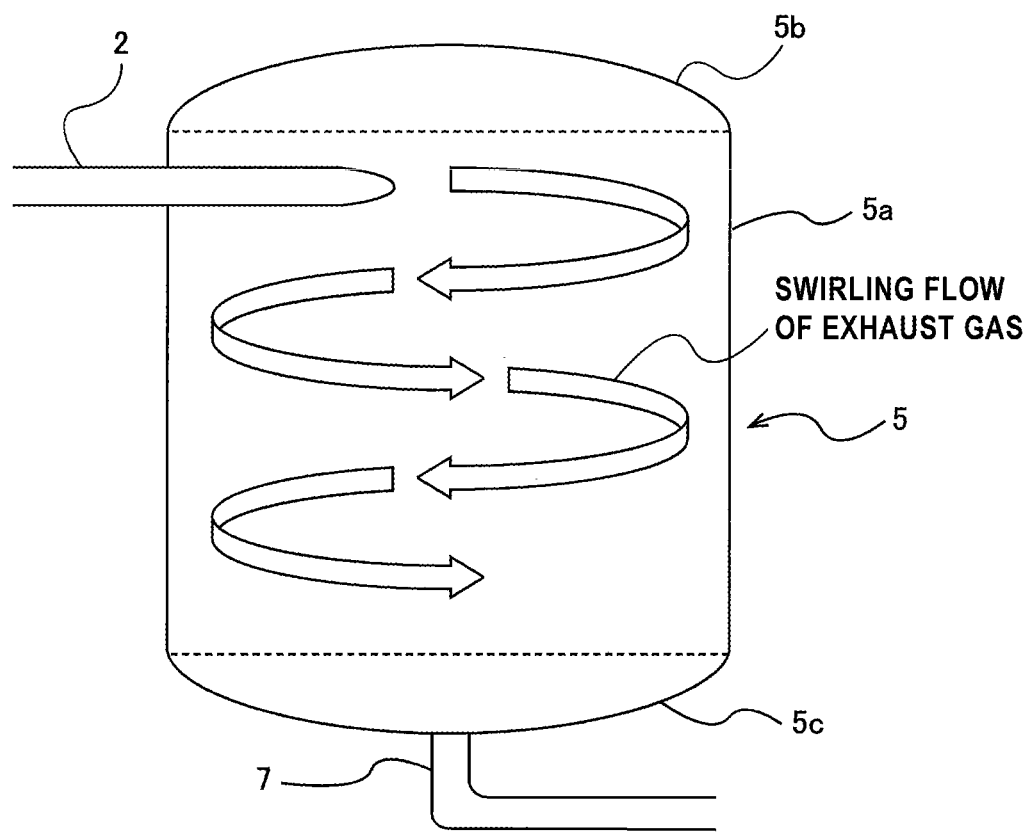
FIG. 2B is a schematic view showing a swirling flow of an exhaust gas formed in the buffer tank.

FIG. 2A is a schematic cross-sectional view showing a connecting portion between the inlet line 2 and the main body (cylindrical-shaped portion) 5a of the buffer tank 5, and FIG. 2B is a schematic view showing a swirling flow of the exhaust gas formed in the buffer tank 5. As shown in FIG. 2A, the inlet line 2 is coupled to the upper part of the main body (cylindrical-shaped portion) 5a of the buffer tank 5 so as to introduce the exhaust gas toward a tangential direction of the inner surface of the main body 5a. When the exhaust gas is introduced in the direction tangential of the main body 5a of the buffer tank 5, a swirling flow of exhaust gas along the inner peripheral surface of the main body 5a is formed in the main body 5a of the buffer tank 5, as shown in FIG. 2B.

The present inventors have thoroughly researched an exhaust system capable of diluting a large amount of hydrogen gas contained in an exhaust gas to a concentration below the lower explosive limit, and have obtained the following findings. Specifically, it has found that, when the exhaust gas is introduced toward the tangential direction of the buffer tank 5 to thereby form the swirling flow of exhaust gas in the buffer tank 5, the hydrogen gas contained in the exhaust gas remains in the upper part of the buffer tank 5, while the remaining gas heavier than the hydrogen gas (in this embodiment, the base gas and the pump purge gas) moves (diffuses) toward a bottom of the buffer tank 5. Hereinafter, this finding will be described in detail.

Figure 3:
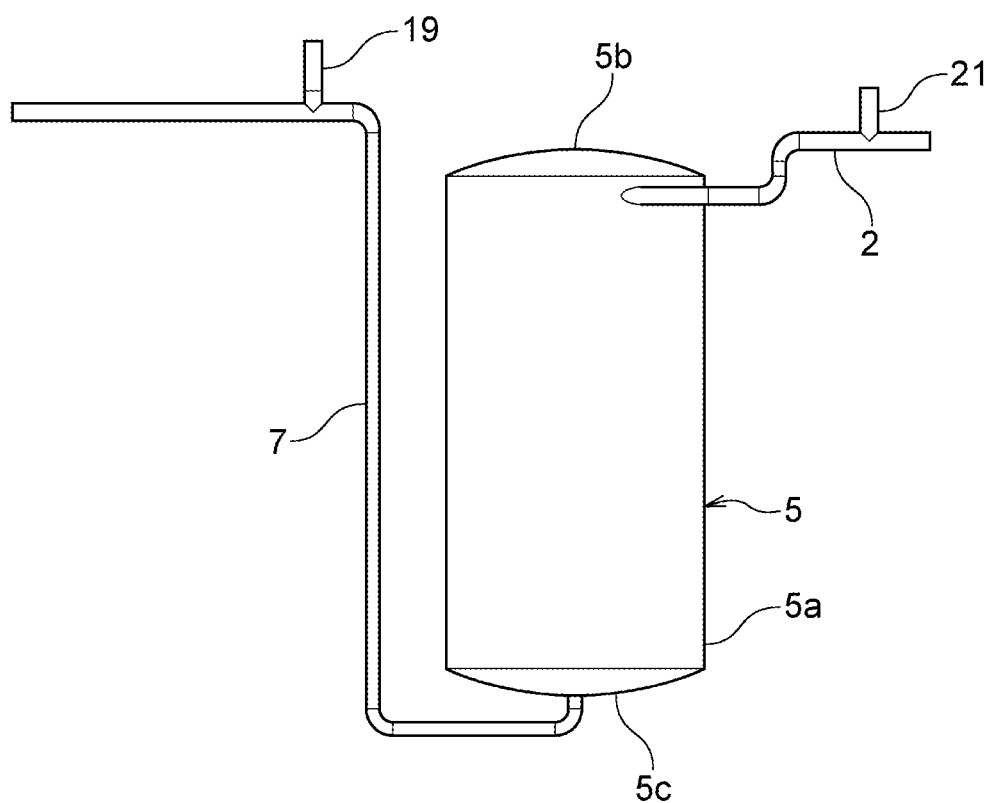
FIG. 3 is a schematic view showing a buffer tank of an exhaust system used in a simulation.

First, the present inventors performed a simulation modeled on the exhaust system 1 shown in FIG. 1. FIG. 3 is a schematic view showing a buffer tank of the exhaust system used in the simulation. In FIG. 3, components which are identical to or correspond to components of the exhaust system shown in FIG. 1 are denoted by identical reference numerals, and will not be described in duplication. In this simulation, a concentration distribution of the hydrogen gas in the buffer tank 5 when the exhaust gas discharged from the EUV exposure equipment 50 was introduced in the tangential direction to the main body 5a of the buffer tank 5 was analyzed. Further, in this simulation, a concentration of hydrogen gas contained in the exhaust gas discharged from the lower part of the buffer tank 5 into the outlet line 7, and a pressure change of the exhaust gas in the buffer tank 5 were also analyzed.

The conditions for this simulation are as follows.
(1) Volume of the buffer tank 5: 800 L
(2) Height (length in a vertical direction) of the main body 5a of the buffer tank 5: 1350 mm (3) Flow rate of the exhaust gas introduced into the inlet line 2:
   (a) 0-5 [sec]→810 [slm]
   (b) 5-25 [sec]→250 [slm]
(4) Flow rate of hydrogen gas contained in the exhaust gas:
   (a) 0-5 [sec]→560 [slm]
   (b) 5-25 [sec]→172.8 [slm]
(5) Flow rate of nitrogen gas contained in exhaust gas
   (a) 0-5 [sec]→250 [slm]
   (b) 5-25 [sec]→77.2 [slm]
(6) Flow rate of purge gas (nitrogen gas): 2 [slm].
(7) Flow rate of dilution gas: 600 [slm].
(8) End of the outlet line 7: open to the atmosphere Since the end of the outlet line 7 is opened to the atmosphere, a pressure of gas in the buffer tank 5 before the exhaust gas is introduced is equal to atmospheric pressure.

As described above, the EUV exposure equipment 50, which has received the error signal from the exhaust gas treatment system 52, shuts off the supplies of hydrogen gas and base gas (nitrogen gas) to the light source unit and the exposure unit after a predetermined delay time has elapsed after receiving the error signal. In this simulation, the predetermined delay time was set to 5 seconds. Therefore, the flow rate of hydrogen gas contained in the exhaust gas introduced into the buffer tank 5 from a start of the simulation until 5 seconds (delay time) has elapsed, is the same as the flow rate of hydrogen gas supplied to the EUV exposure equipment 50, which was set to 560 [slm (standard L/min)] in this simulation (see item (4) (a) in the above simulation conditions).

Further, even though the predetermined delay time has elapsed and the supplies of hydrogen gas and base gas to the EUV exposure equipment 50 is shut off, the gas including the large amount of hydrogen gas remains in the EUV exposure equipment 50 and the exhaust line 55. In this simulation, the flow rate of hydrogen gas introduced into the buffer tank 5 during a period when 20 seconds have elapsed after the end of the predetermined delay time (i.e., a period from 5 seconds to 25 seconds when viewed from the start of the simulation) was set to 172.8 [slm] (see item (4) (b) in the above simulation conditions). In this simulation, it is assumed that the hydrogen gas which is contained in the exhaust gas remaining in the EUV exposure equipment 50 and the exhaust line 55 is completely introduced into the buffer tank 5 when 25 seconds have elapsed from the start of the simulation.

The flow rate of nitrogen gas which is contained in the exhaust gas introduced into the buffer tank 5 during a period from the start of the simulation to the elapse of 5 seconds (delay time) is the sum of the flow rate of nitrogen gas supplied to the EUV exposure equipment 50 and the flow rate of nitrogen gas supplied to the dry pump 51 as pump purge gas. In this simulation, this flow rate of nitrogen gas was set to 250 [slm] (see item (5) (a) in the above simulation conditions). After elapse of the predetermined delay time, the flow rate of nitrogen gas containing in the exhaust gas is equal to the flow rate of nitrogen gas supplied to the dry pump 51 as pump purge gas, because the supply of nitrogen gas to the EUV exposure equipment 50 is shut off. In this simulation, this flow rate of nitrogen gas was set to 77.2 [slm] (see item (5) (b) in the above simulation conditions).

Further, the inlet line 2 is constantly supplied with purge gas from the purge line 21, and this purge gas is also introduced into the buffer tank 5. In this simulation, nitrogen gas was used as the purge gas, and the flow rate of purge gas was set to 2 [slm].

Figure 4:
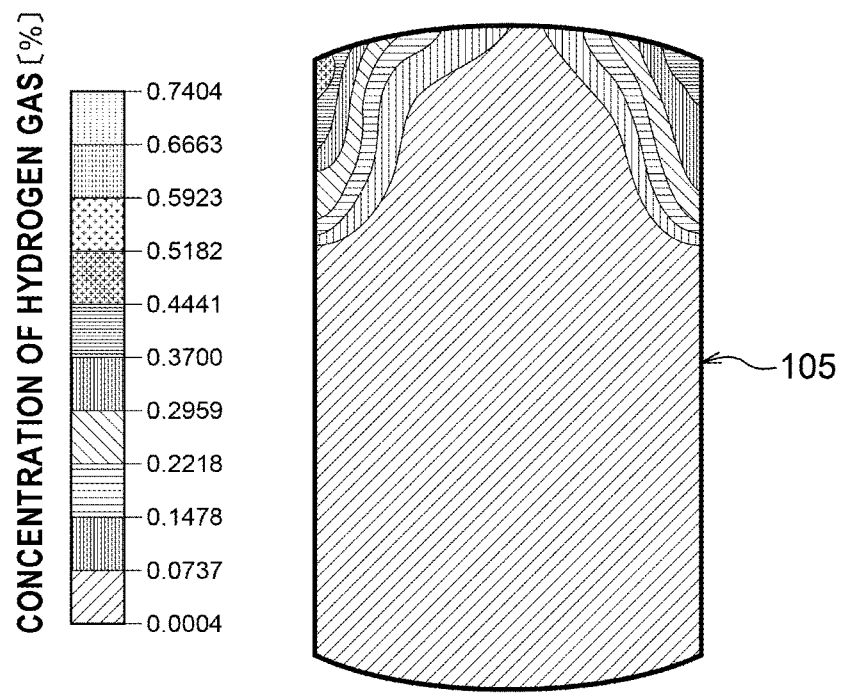
FIG. 4 is a view showing simulation results representing a concentration distribution of the hydrogen gas in the buffer tank immediately after the elapse of 5 seconds from the start of the simulation.
Figure 5:
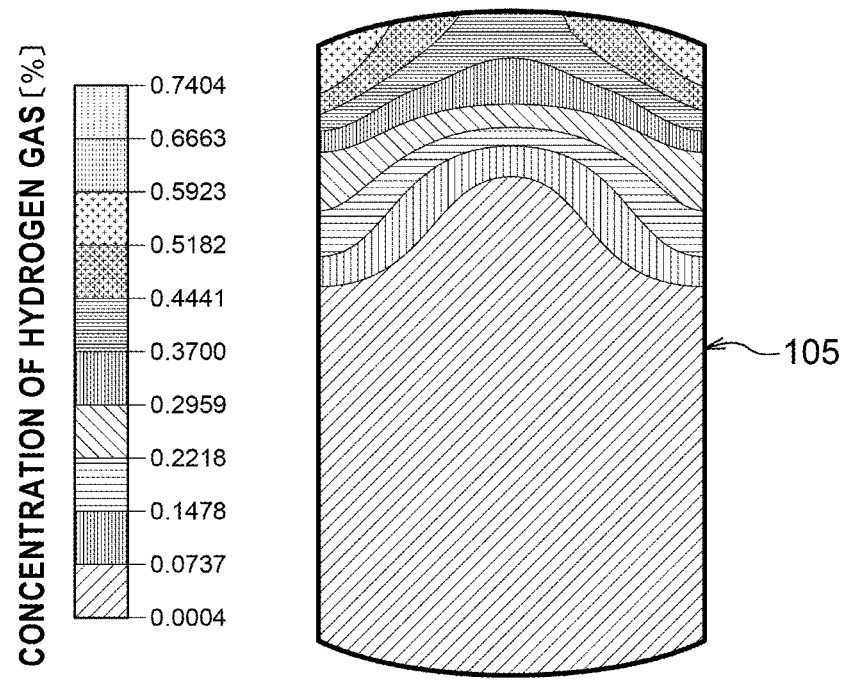
FIG. 5 is a view showing simulation results representing a concentration distribution of the hydrogen gas in the buffer tank after the elapse of 25 seconds from the start of the simulation.

FIG. 4 is a view showing simulation results representing a concentration distribution of the hydrogen gas in the buffer tank 5 immediately after the elapse of 5 seconds from the start of the simulation (that is, immediately after the elapse of the predetermined delay time). FIG. 5 is a view showing simulation results representing a concentration distribution of the hydrogen gas in the buffer tank 5 after the elapse of 25 seconds from the start of the simulation. The simulation results shown in FIG. 5 represents the concentration distribution of hydrogen gas immediately after the hydrogen gas remaining in the EUV exposure equipment 50 and the exhaust line 55 is completely introduced into the buffer tank 5.

It was found from the simulation results shown in FIGS. 4 and 5 that the concentration of hydrogen gas increased toward the upper part of the buffer tank 5 while decreasing toward the lower part of the buffer tank 5. As is clear from the simulation results shown in FIG. 5, the concentration of hydrogen gas in the lower part of the buffer tank 5 is almost 0 even after 25 seconds have elapsed from the start of the simulation. These simulation results indicate that, when the exhaust gas containing the large amount of hydrogen gas is introduced in the tangential direction of the buffer tank 5, most of the hydrogen gas remains in the upper part of the buffer tank 5 and only the nitrogen gas moves (diffuses) toward the lower part of the buffer tank 5. However, it was also found that, as time passes from the start of the simulation, the hydrogen gas gradually diffuses from the upper part of the buffer tank 5 toward the lower part of the buffer tank 5.

Figure 6A:
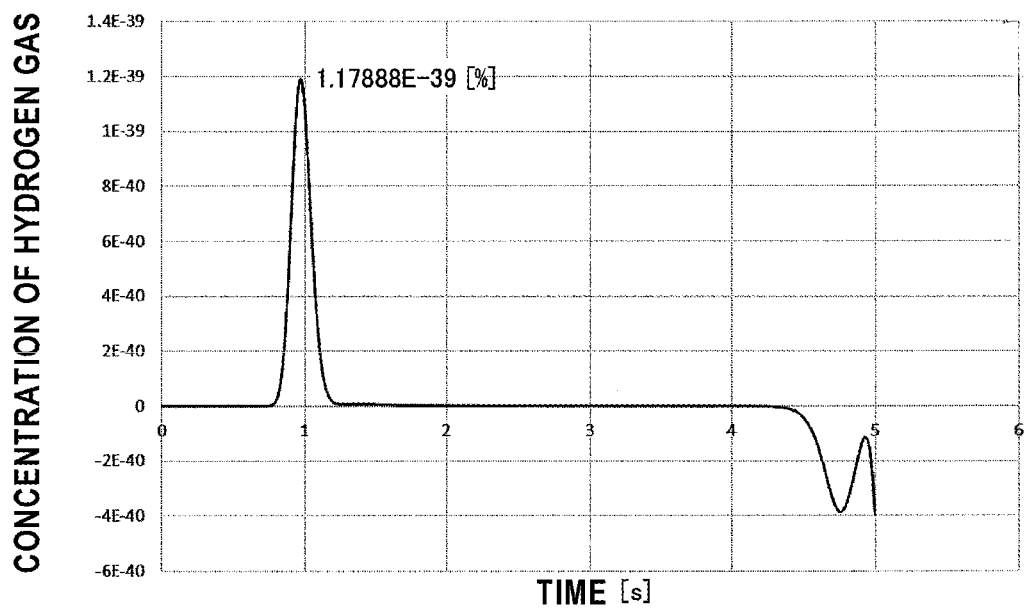
FIG. 6A is a graph showing the simulation results representing the change in the concentration of hydrogen gas in the exhaust gas discharged from the buffer tank to the outlet line during a period from the start of the simulation to the elapse of a predetermined delay time.
Figure 6B:
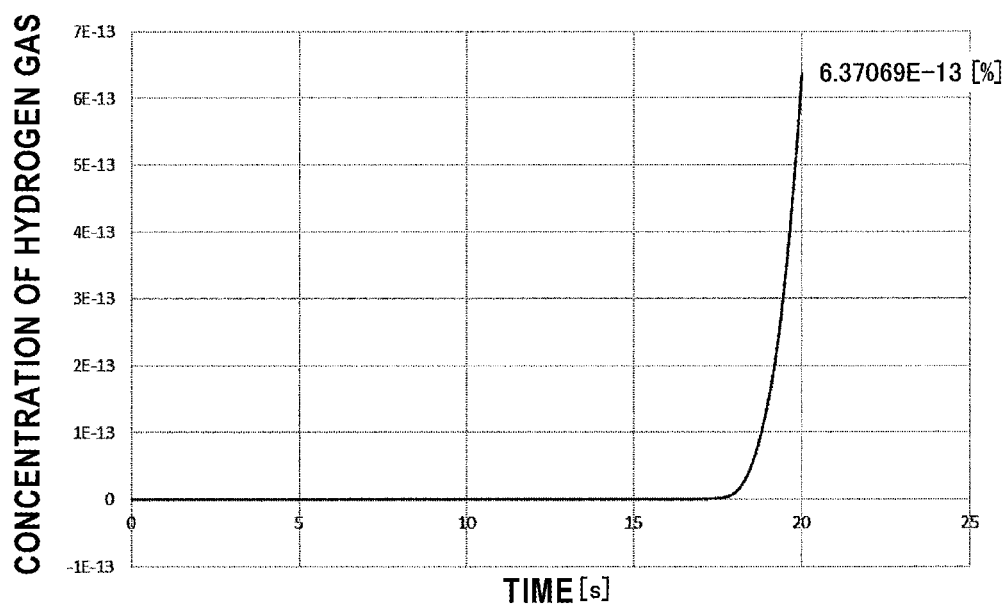
FIG. 6B is a graph showing the simulation results representing the change in the concentration of hydrogen gas in the exhaust gas discharged from the buffer tank to the outlet line during a period from reaching the predetermined delay time to the elapse of 20 seconds.

FIG. 6A is a graph showing the simulation results representing the change in the concentration of hydrogen gas in the exhaust gas discharged from the buffer tank 5 to the outlet line 7 during a period from the start of the simulation to the elapse of the predetermined delay time (5 seconds). FIG. 6B is a graph showing the simulation results representing the change in the concentration of hydrogen gas in the exhaust gas discharged from the buffer tank 5 to the outlet line 7 during a period from reaching the predetermined delay time to the elapse of 20 seconds. In FIGS. 6A and 6B, a vertical axis represents the concentration of hydrogen gas, and a horizontal axis represents time. In FIG. 6B, the origin of the horizontal axis (i.e., 0 [s]) corresponds to the time after 5 seconds have elapsed from the start of the simulation. Therefore, in the graph shown in FIG. 6B, the scale 20 [s] on the horizontal axis corresponds to the time when 25 seconds have elapsed when viewed from the start of the simulation.

The simulation results shown in FIG. 6A show that the concentration of hydrogen gas reaches a peak value (maximum value) of 1.17888E-39 [%] when 1 second has passed from the start of the simulation. However, the concentration of hydrogen gas of 1.17888E-39 [%] is almost 0, and it is reasonable to assume that the exhaust gas flowing in the outlet line 7 does not contain the hydrogen gas, considering that the simulation includes analysis errors and other factors.

The simulation results shown in FIG. 6B show that the concentration of hydrogen gas begins to gradually increase when 23 seconds has passed from the start of the simulation, and the concentration of hydrogen gas reaches a maximum value of 6.37069E-13 [%] when 25 seconds has passed from the start of the simulation. However, the concentration of hydrogen gas of 6.37069E-13 [%] is also almost zero, and it is reasonable to assume that the exhaust gas flowing in the outlet line 7 does not contain the hydrogen gas, considering that the simulation includes analysis errors and other factors.

Surprisingly, the simulation results shown in FIGS. 4 through 6B show that the exhaust gas containing the large amount of hydrogen gas is introduced in the tangential direction of the buffer tank 5, resulting in staying the hydrogen gas in the upper part of the buffer tank 5, while only nitrogen gas, which is heavier than the hydrogen gas, moves toward the lower part of the buffer tank 5. In order to confirm the findings obtained by the simulation, the present inventors actually created an experimental exhaust system having the same configuration as the exhaust system 1 shown in FIG. 1, and conducted experiments to measure the concentration of hydrogen gas in the exhaust gas flowing in the outlet line 7 by applying the same conditions as those of the above simulation to the experimental exhaust system.

As shown by a virtual line (dotted line) in FIG. 1, the experimental exhaust system has a sample port SP for measuring the concentration of hydrogen gas in the exhaust gas flowing in the outlet line 7. A sample of the exhaust gas flowing in the outlet line 7 can be taken out through the sample port SP. In the experiments, a sample of the exhaust gas was taken out from the sample port SP, and the concentration of hydrogen gas in this sample was measured with a hydrogen-gas concentration measuring device. The lower limit of detection of the hydrogen-gas concentration measuring device used in the experiments is 0.1%.

In these experiments as well, the hydrogen-gas concentration measuring device could not detect the hydrogen gas during a period when 25 seconds has passed from the introduction of the exhaust gas into the buffer tank 5. Therefore, the experiments of actually introducing the exhaust gas into the buffer tank 5 using the experimental exhaust system also confirmed that the exhaust gas discharged from the buffer tank 5 to the outlet line 7 did not contain the hydrogen gas. These experimental results support that the above simulation results are correct.

It is presumed that the phenomenon that, when the exhaust gas is introduced in the tangential direction of the buffer tank 5, the hydrogen gas is stayed in the upper part of the buffer tank 5, while only nitrogen gas moves toward the lower part of the buffer tank 5, occurs based on the following reasons.

(1) Since the nitrogen gas is heavier than the hydrogen gas (i.e., the nitrogen gas has a greater specific gravity than that of hydrogen gas), the buoyancy of hydrogen gas in the buffer tank 5 filled with the nitrogen gas is greater than the buoyancy of nitrogen gas contained in the exhaust gas.

(2) When the exhaust gas containing the hydrogen gas and the nitrogen gas is introduced in the tangential direction of the buffer tank 5 to form the swirling flow of the exhaust gas, the nitrogen gas moves (diffuses) toward the bottom of the buffer tank 5 prior to the hydrogen gas due to the difference between the buoyancy of the hydrogen gas and the buoyancy of the nitrogen gas.

(3) As a result, a downward diffusion of the hydrogen gas in the vertical direction in the buffer tank 5 is hindered.

Conventionally, a cyclone separator has been known as a device for separating powder contained in a fluid (for example, a gas such as air) from the fluid. In the cyclone separator, a swirling flow of the fluid containing the powder is formed in the tank, and the powder heavier than the fluid is pressed against the inner peripheral surface of the tank to separate the powder from the fluid. More specifically, in the cyclone separator, the powder is separated from the fluid by utilizing the difference between a centrifugal force acting on the fluid and a centrifugal force acting on the powder.

The principle of the cyclone separator is in contrast to the above findings. According to the principle of the cyclone separator, the nitrogen gas heavier than the hydrogen gas is pressed against the inner peripheral surface of the buffer tank 5, causing the diffusion of the nitrogen gas in the buffer tank 5 to be hindered. However, in the above simulations and experiments, the hydrogen gas, which is lighter than the nitrogen gas, stays in the upper part of the buffer tank 5, while the nitrogen gas is preferentially diffused downward in the buffer tank 5. The above findings found by the present inventors are the opposite of the principle of the cyclone separator, and are novel findings that have not yet been reported.

Figure 7A:
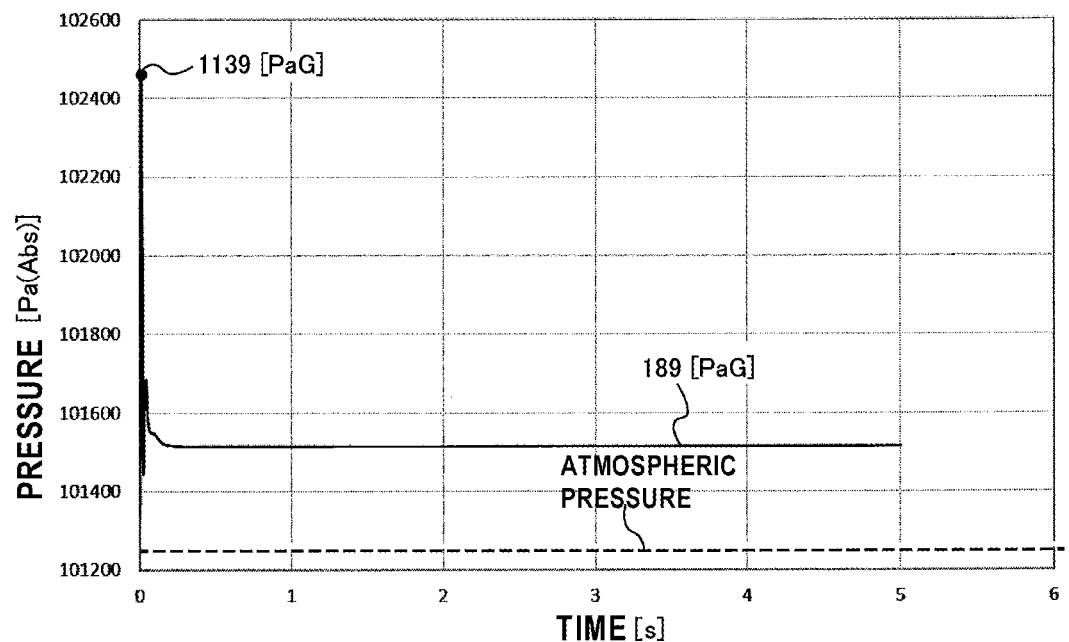
FIG. 7A is a graph showing simulation results representing a change in the pressure of the exhaust gas in the buffer tank during a period from the start of the simulation to the elapse of the predetermined delay time.
Figure 7B:
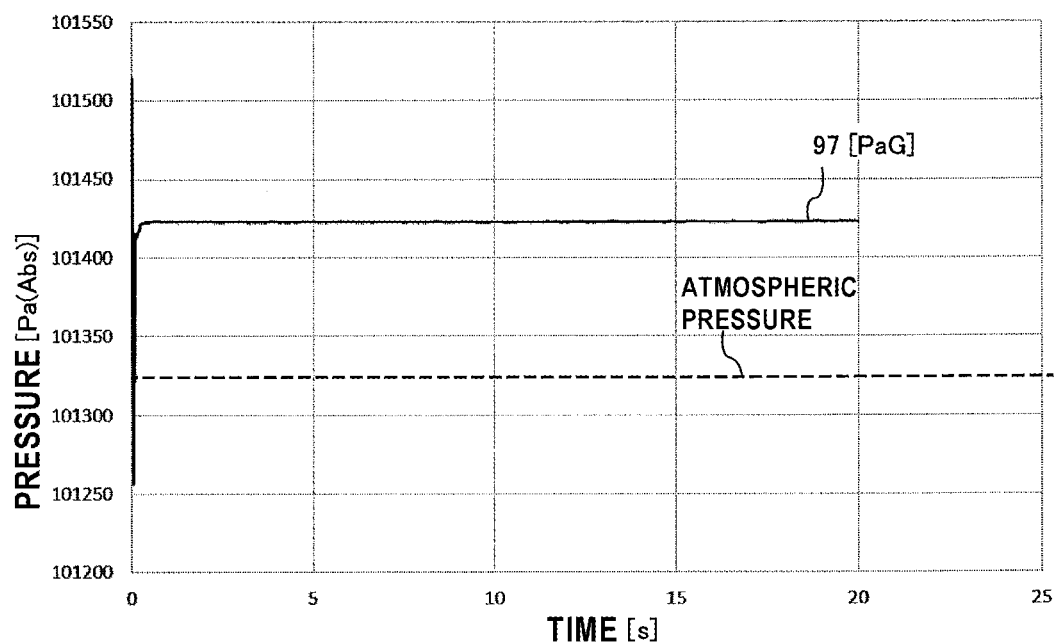
FIG. 7B is a graph showing simulation results representing a change in the pressure of the exhaust gas in the buffer tank during a period from reaching the predetermined delay time to the elapse of 20 seconds.

FIG. 7A is a graph showing simulation results representing a change in the pressure of the exhaust gas in the buffer tank 5 during a period from the start of the simulation to the elapse of the predetermined delay time (5 seconds). FIG. 7B is a graph showing simulation results representing a change in the pressure of the exhaust gas in the buffer tank 5 during a period from reaching the predetermined delay time to the elapse of 20 seconds. In FIGS. 7A and 7B, a vertical axis represents the pressure of the exhaust gas, and a horizontal axis represents the time. In FIG. 7B, the origin of the horizontal axis (i.e., time 0 [s]) corresponds to the time after 5 seconds have elapsed from the start of the simulation. Therefore, in the graph shown in FIG. 7B, the scale 20 [s] on the horizontal axis corresponds to the time when 25 seconds have elapsed when viewed from the start of the simulation. Furthermore, it should be noted that scales on the vertical axes in FIGS. 7A and 7B are represented by absolute pressure. For this reason, in FIGS. 7A and 7B, the atmospheric pressure is shown as a dotted line, and the pressure of the exhaust gas analyzed in the simulation is converted to gauge pressure.

As shown in FIG. 7A, after the elapse of 0.01 s from the start of the simulation, the pressure of the exhaust gas in the buffer tank 5 increased to 1139 [PaG], and then stabilized at a pressure of 189 [PaG]. The pressure peak immediately after the start of the simulation is due to the sudden introduction of exhaust gas having a flow rate of 810 [slm] into the buffer tank 5. The simulation results shown in FIG. 7B show that the pressure of the exhaust gas in the buffer tank 5 stabilizes at 97 [PaG]. In this manner, the simulation results shown in FIGS. 7A and 7B show that the increase in the pressure of the exhaust gas in the buffer tank 5 is very small.

In the experiment using the above-described experimental exhaust system 1 also, the pressure of the exhaust gas in the buffer tank 5 hardly increased. Therefore, it was found that, if the outlet line 7 is not provided with a device (for example, a flow controller) that prevents the smooth discharge of the exhaust gas from the buffer tank 5, an excessive backpressure was not applied to an equipment (for example, the dry pump 51 of the EUV exposure equipment 50) located upstream of the buffer tank 5.

Next, a method of diluting and releasing a large amount of hydrogen gas to the atmosphere by use of the exhaust system 1 shown in FIG. 1 will be described with reference to FIGS. 8 to 11. The method is based on the above findings that the hydrogen gas which is contained in the exhaust gas introduced in the tangential direction of the buffer tank 5 stays in the upper part of the buffer tank 5, while the nitrogen gas heavier than the hydrogen gas moves (diffuses) to the lower part of the buffer tank 5. Further, in this method, the hydrogen gas and the nitrogen gas in the buffer tank 5 are selectively discharged by use of the outlet line 7 and the hydrogen discharge line 15 provided at the lower part and the upper part of the buffer tank 5, respectively. More specifically, the controller 25 appropriately controls the opening and closing operations of the plurality of valves of the exhaust system 1 including the first outlet valve and the second outlet valve 16 provided in the outlet line 7 and the hydrogen discharge line 15 to thereby selectively discharge the hydrogen gas and the nitrogen gas heavier than the hydrogen gas from the buffer tank 5.

Figure 9:
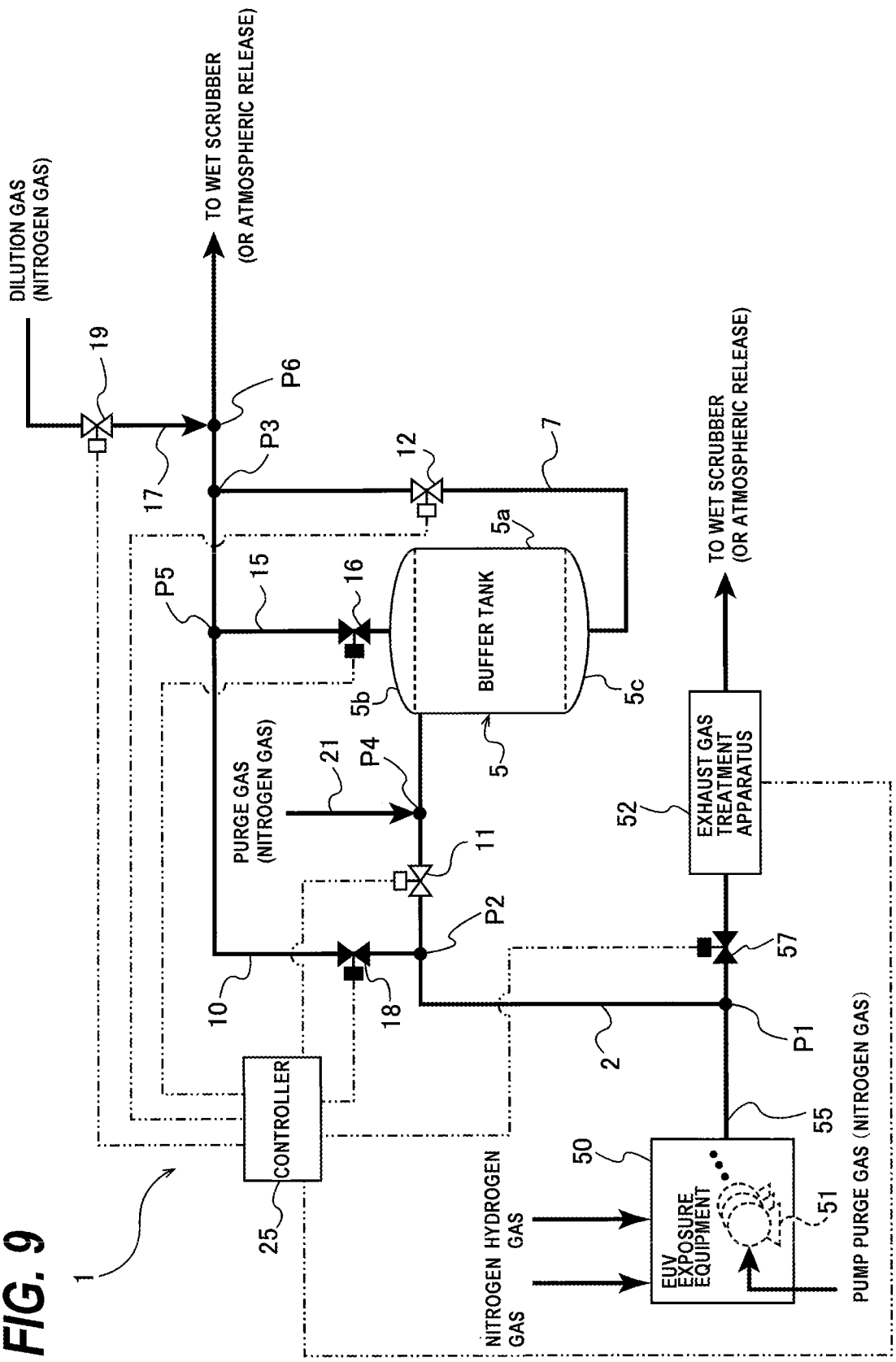
FIG. 9 is a view showing opened/closed states of the plurality of valves of the exhaust system during a first exhaust operation.
Figure 10:
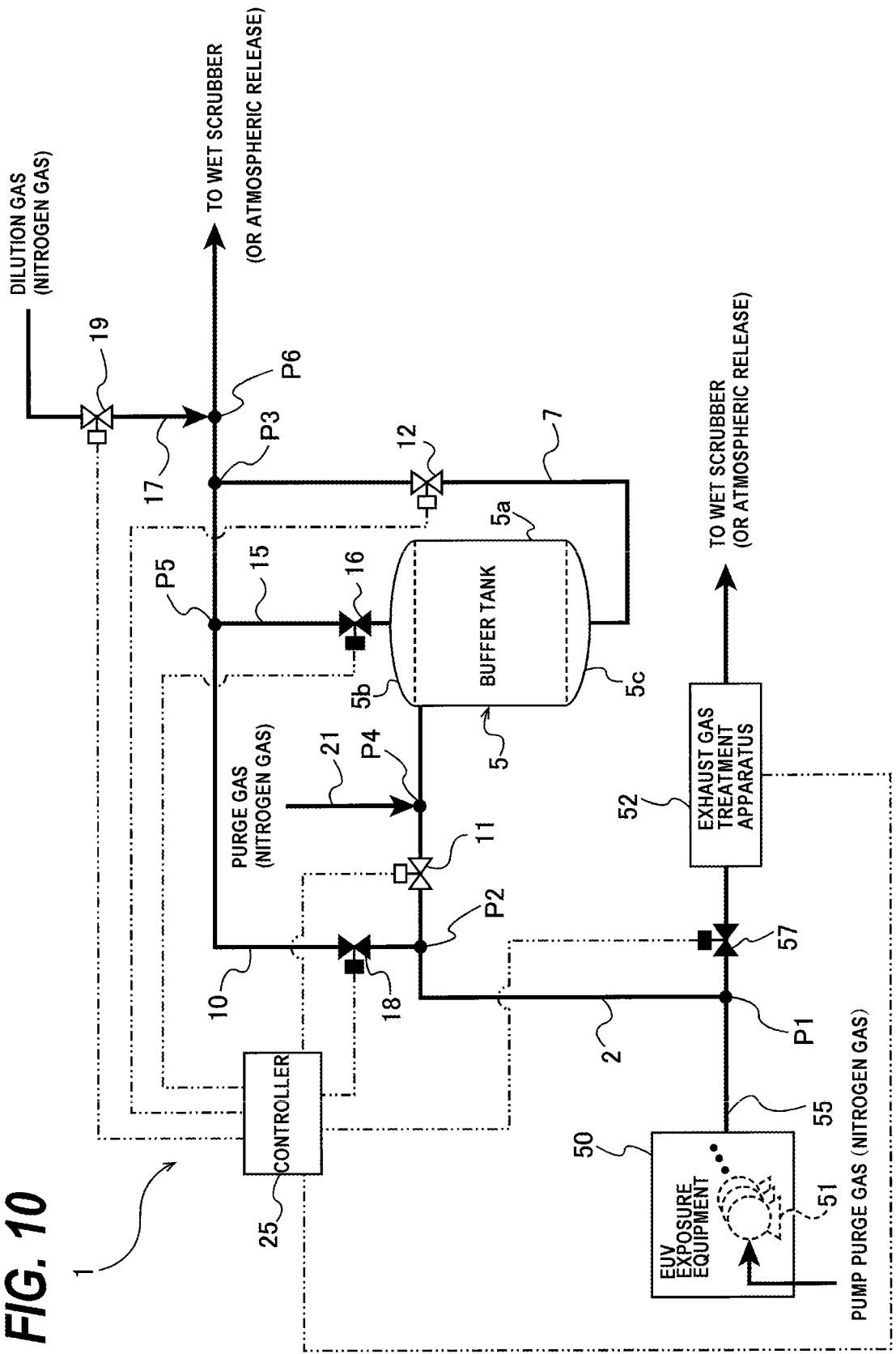
FIG. 10 is a view showing opened/closed states of the plurality of valves of the exhaust system during a second exhaust operation.
Figure 11:
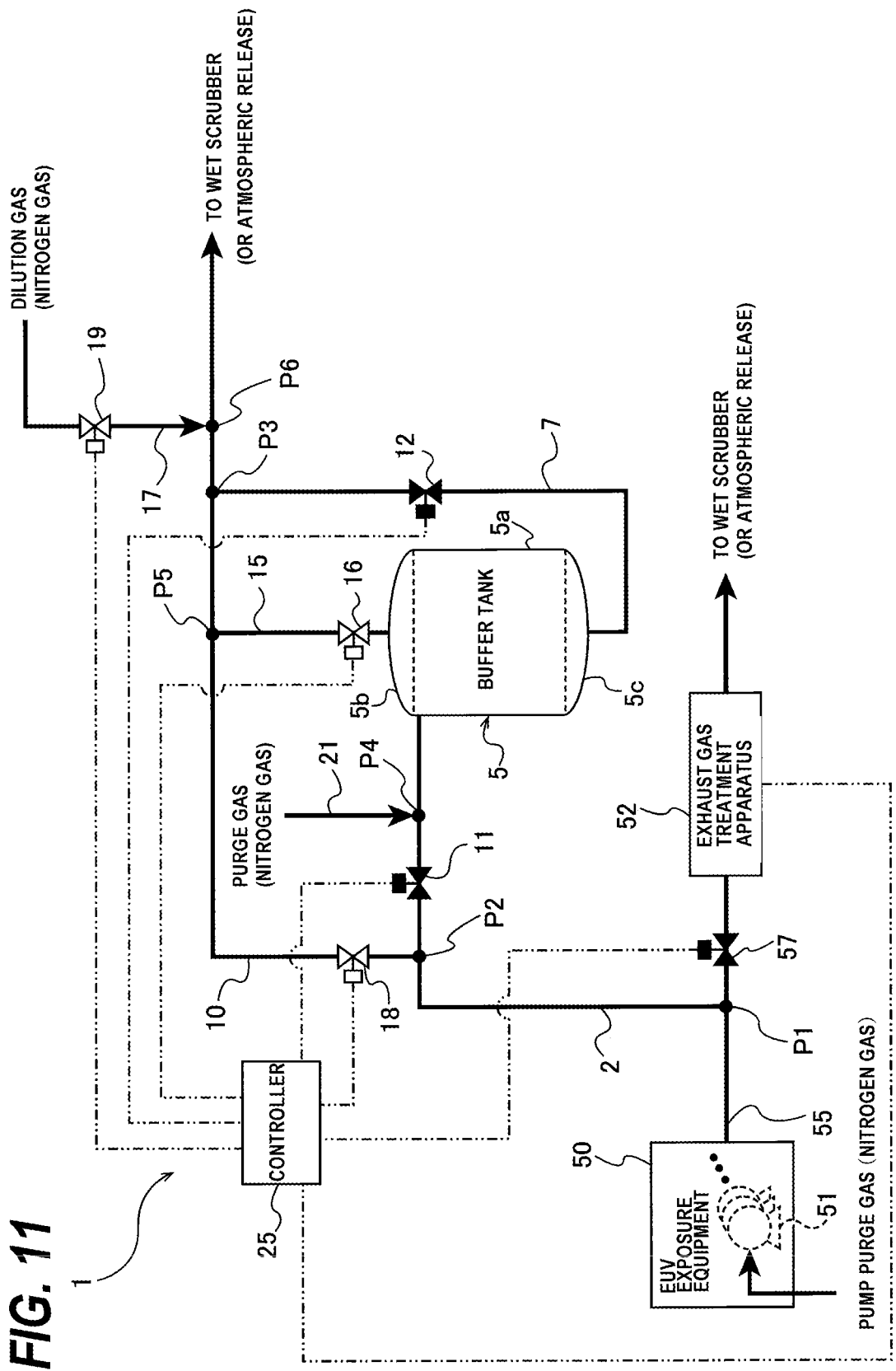
FIG. 11 is a view showing opened/closed states of the plurality of valves of the exhaust system during a third exhaust operation.

FIG. 8 is a view showing opened/closed states of the plurality of valves 11, 12, 16, 18, and 19 of the exhaust system 1 during normal operation of the exhaust gas treatment apparatus 52. In FIG. 8, white valves represent valves in the opened state, and black-painted valves represent valves in the closed state. In FIGS. 9 to 11 as well, which will be described later, the white valves represent the valve in the opened state, and the black-painted valves represent the valves in the closed state.

As shown in FIG. 8, while the exhaust gas treatment system 52 is operating normally, the main valve 57 located in the exhaust line 55 is open, while the inlet valve 11 and the bypass valve 18 of the exhaust system 1 are closed. Therefore, the exhaust gases emitted from the EUV exposure system 50 are supplied to the exhaust gas treatment system 52 via the exhaust line 55 and are not introduced into the exhaust system 1.

During normal operating of the exhaust gas treatment apparatus 52, the first outlet valve 12 disposed in the outlet line 7 of the exhaust system 1 is opened, and the second outlet valve 16 disposed in the hydrogen discharge line 15 is closed. Thus, the purge gas (nitrogen gas) supplied from the purge gas line 21 to the upper part of the buffer tank 5 through the inlet line 2 fills the buffer tank 5, and is further discharged from the lower part of the buffer tank 5 to the wet scrubber through the outlet line 7. The flow rate of the purge gas is regulated to a predetermined flow rate by a flow controller (e.g., a needle valve or a mass flow controller), which is not shown in the drawings. Further, the dilution-gas introduction valve 19 disposed in the dilution line 17 of the exhaust system 1 is closed, preventing the introduction of dilution gas into the outlet line 7.

FIG. 9 is a view showing opened/closed states of the plurality of valves 11, 12, 16, 18, 19 of the exhaust system 1 during a first exhaust operation. The first exhaust operation is an exhaust operation performed during a period from the shutdown of the exhaust gas treatment apparatus to the elapse of the above-mentioned predetermined delay time. During the first exhaust operation, the hydrogen gas and the base gas are supplied to the light source unit and the exposure unit of the EUV exposure equipment 50 at normal flow rates. Therefore, during the first exhaust operation, the exhaust gas introduced into the inlet line 2 of the exhaust system 1 includes the hydrogen gas and the base gas having the normal flow rates supplied to the EUV exposure equipment 50.

As shown in FIG. 9, when the exhaust gas treatment system 52 is shut down, the main valve 57 is closed. At the same time as the main valve 57 is closed, the controller 25 of the exhaust system 1 opens the inlet valve 11 disposed in the inlet line 2 and the first outlet valve 12 disposed in the outlet line 7 to thereby introduce the exhaust gas discharged from the EUV exposure equipment 50 into the inlet line 2 of the exhaust system 1. In this embodiment, since the first outlet valve 12 is open during normal operation of the exhaust gas treatment apparatus 52, the controller 25 maintains the first outlet valve 12 open.

The controller 25 maintains the bypass valve 18 in a closed state. The exhaust gas introduced into the inlet line 2 is introduced in the tangential direction of the cylindrical shaped portion 5a of the buffer tank 5, thereby forming the swirling flow in the buffer tank 5. As described above, the hydrogen gas contained in the exhaust gas stays in the upper part of the buffer tank 5, while the nitrogen gas, which is heavier than the hydrogen gas, moves toward the lower part of the buffer tank 5. The controller 25 maintains the second outlet valve 16 in the closed state to prevent the hydrogen gas contained in the exhaust gas from being discharged from the upper part of the buffer tank 5 to the outlet line 7 through the hydrogen discharge line 15. On the other hand, the controller 25 maintains the first outlet valve 12 in the opened to discharge the nitrogen gas contained in the exhaust gas from the lower part of the buffer tank 5 to the outlet line 7.

In this embodiment, the controller 25 opens the inlet valve 11 and the first outlet valve 12, and at the same time, opens the dilution-gas introduction valve 19 to introduce the dilution gas (nitrogen gas) from the dilution gas line 17 to the outlet line 7. This operation prevents the hydrogen gas having a high concentration from reaching the wet scrubber even if a small amount of hydrogen gas flows out of the lower part of the buffer tank 5 into the outlet line 7.

FIG. 10 is a view showing opened/closed states of the plurality of valves 11, 12, 16, 18, 19 of the exhaust system 1 during a second exhaust operation. The second exhaust operation is an exhaust operation performed after the above-mentioned predetermined delay time has elapsed, and is an exhaust operation for receiving the hydrogen gas remaining in the EUV exposure equipment 50 and the exhaust line 55 into the buffer tank 5. The opened/closed states of the plurality of valves 11, 12, 16, 18, and 19 of the exhaust system 1 during the second exhaust operation are the same as the opened/closed states of the plurality of valves 11, 12, 16, 18, and 19 of the exhaust system 1 during the first exhaust operation.

As described above, when the predetermined delay time has elapsed, the EUV exposure equipment 50 shuts off the supplies of the hydrogen gas and the base gas to the light source unit and exposure unit while continuing to operate the dry pump 51. thus, the exhaust gas remaining in the EUV exposure equipment 50 and the exhaust line 55, and the pump purge gas (nitrogen gas) supplied to the dry pump 51 are introduced into the inlet line 2 of the exhaust system 1. Hereinafter, the exhaust gas remaining in the EUV exposure equipment 50 and the exhaust line 55 after the predetermined delay time has elapsed is referred to as "remained exhaust gas". The remained exhaust gas also contains a large amount of hydrogen gas.

The controller 25 maintains, until the remained exhaust gas is introduced into the buffer tank 5, the inlet valve 11, the first outlet valve 12, and the dilution-gas introduction valve 19 in the opened state, and the bypass valve 18 and the second outlet valve 16 in the closed state. The second exhaust operation is continued until all remained exhaust gas is introduced into the buffer tank 5. The time for performing the second exhaust operation (i.e., the duration of the second exhaust operation) is calculated based on the sum of volumes of the light source unit and the exposure unit of the EUV exposure equipment 50, and the sum of volumes of pipes extending from the light source unit and the exposure unit to the buffer tank 5, and the flow rate of the pump purge gas supplied to the dry pump 51. For example, the duration of the second exhaust operation is obtained by dividing the above-mentioned sums by the flow rate of the pump purge gas. It is preferable to correct the duration of the second exhaust operation by multiplying the time obtained in this manner by a safety factor, which is a value of one or more, or by adding a predetermined amount of time.

In this specification, the open/close operations of the valves of the exhaust system 1 performed during a period from the shutdown of the exhaust gas treatment system 52 to the introduction of all hydrogen gas supplied to the EUV exposure equipment 50 into the buffer tank 5 is referred to as an "initial exhaust operation". Specifically, the initial exhaust operation is composed of the first exhaust operation shown in FIG. 9 and the second exhaust operation shown in FIG. 10.

FIG. 11 is a view showing the opened/closed states of the plurality of valves 11, 12, 16, 18, and 19 of the exhaust system 1 during the third exhaust operation. The third exhaust operation is an operation for diluting the hydrogen gas stayed in the upper part of the buffer tank 5 until a concentration thereof is below the lower explosive limit, and discharging it from the exhaust system 1. In this specification, this third exhaust operation is referred to as a "hydrogen-gas exhaust operation".

The hydrogen-gas exhaust operation is performed after the initial exhaust operation has been continued for a predetermined time. The duration of the initial exhaust operation corresponds to the sum of the time when the first exhaust operation is performed (i.e., the predetermined delay time) and the time when the second exhaust operation is performed (i.e., the duration of the second exhaust operation).

In the hydrogen-gas exhaust operation, the controller 25 closes the inlet valve 11 and the first outlet valve 12, and opens the bypass valve 18, the second outlet valve 16, and the dilution-gas introduction valve 19. Since, in this embodiment, the dilution-gas introduction valve 19 has already been opened during the initial exhaust operation, the controller 25 maintains the dilution-gas introduction valve 19 in the opened state.

During the hydrogen-gas exhaust operation, the exhaust gas introduced into the inlet line 2 contains the pump purge gas supplied to the dry pump 51, but the exhaust gas is discharged from the inlet line 2 through the bypass line 10 to the outlet line 7. Thus, opening the bypass valve 18 prevents an excessive back-pressure from being applied to the dry pump 51.

When the second outlet valve 16 is opened with the inlet valve 11 and the first outlet valve 12 closed, the exhaust gas in accordance with the flow rate of the purge gas supplied to the buffer tank 5 from the purge gas line 21 is discharged from the upper part of the buffer tank 5 through the hydrogen discharge line 15 and the bypass line 10 to the outlet line 7. The hydrogen gas discharged into the outlet line 7 is diluted to a concentration below the lower explosive limit by the dilution gas introduced from dilution-gas line 17.

The flow rate of the dilution gas introduced from the dilution-gas line 17 is determined according to the flow rate of the purge gas. More specifically, the flow rate of the dilution gas is calculated assuming that the hydrogen gas is discharged from the buffer tank 5 at the same flow rate as the purge gas. This enables the hydrogen gas discharged from the buffer tank 5 to be reliably diluted to a concentration below the lower explosive limit. For example, if the flow rate of the purge gas is 2 L/min, it is assumed that the hydrogen gas having a flow rate of 2 L/min is discharged from the buffer tank 5 to the hydrogen discharge line 15. In this case, the flow rate of the dilution gas required to dilute the hydrogen gas to a concentration below the lower explosive limit (4%) is 50 L/min.

In a conventional exhaust system in which the exhaust gas is not introduced in the tangential direction of the buffer tank, the hydrogen gas contained in the exhaust gas diffuses into the buffer tank together with the nitrogen gas. In other words, the concentration of hydrogen gas, which is contained in the exhaust gas discharged from the buffer tank, is the same as the concentration of hydrogen gas which is contained in the exhaust gas before it is introduced into the buffer tank. Furthermore, if the flow controller is omitted in a conventional exhaust system for preventing an excessive back-pressure from being applied to a device located upstream of the buffer tank, the flow rate of the exhaust gas discharged from the buffer tank is the same as the flow rate of the exhaust gas introduced into the buffer tank. In this case, the flow rate of the dilution gas is much larger than the flow rate of the dilution gas in the present embodiment. As an example, referring to the above simulation conditions, the flow rate of the hydrogen gas introduced into the buffer tank and discharged from the buffer tank during the predetermined delay time is 560 L/min. In this case, the dilution gas having the flow rate of 14,000 L/min (14 m³/min) is required to dilute the hydrogen gas to a concentration below the lower explosive limit.

According to the present embodiment, the flow rate of dilution gas required by the exhaust system 1 (50 L/min in the above example) is far less than the flow rate of dilution gas required by a conventional exhaust system (14,000 L/min in the above example). Therefore, even if the hydrogen gas is diluted to a concentration much smaller than the lower explosive limit for further safety, the flow rate of the dilution gas supplied from the dilution line 17 to the outlet line 7 does not exceed the flow rate of the dilution gas required in the conventional exhaust system. For example, even in a case where the hydrogen gas is diluted to a concentration of 0.1 times (0.4%) the lower explosive limit, if the flow rate of the purge gas is 2 L/min, the required dilution gas flow rate is 500 L/min.

Furthermore, according to the present embodiment, in the outlet line 7, the exhaust system 1 is unnecessary to provide device (e.g., a flow controller installed in a conventional exhaust system) that inhibits the flow of the exhaust gas discharged from the buffer tank 5. As a result, the pressure in the buffer tank 5 is hardly increased by the exhaust gas introduced into the buffer tank 5, so that an excessive back-pressure is not applied to the dry pump 51 located upstream of the buffer tank 5.

Although, in the above-described embodiment, the controller 25 opens the inlet valve 11, the first outlet valve 12, and the dilution-gas introduction valve 19 during the initial exhaust operation, the present invention is not limited to this embodiment. For example, during the initial exhaust operation, the controller 25 may open only the inlet valve 11 and the first outlet valve 12, and maintain the dilution-gas introduction valve 19 in the closed state. In other words, the controller 25 may open at least the inlet valve 11 and the first outlet valve 12 during the initial exhaust operation. When the exhaust gas containing the hydrogen gas is introduced in the tangential direction of the buffer tank 5, only the nitrogen gas is discharged from the lower part of the buffer tank 5. Therefore, even if the dilution gas is not introduced into the outlet line 7, the concentration of hydrogen gas sent to the wet scrubber is almost 0 (that is, below the lower explosive limit).

Figure 12A:
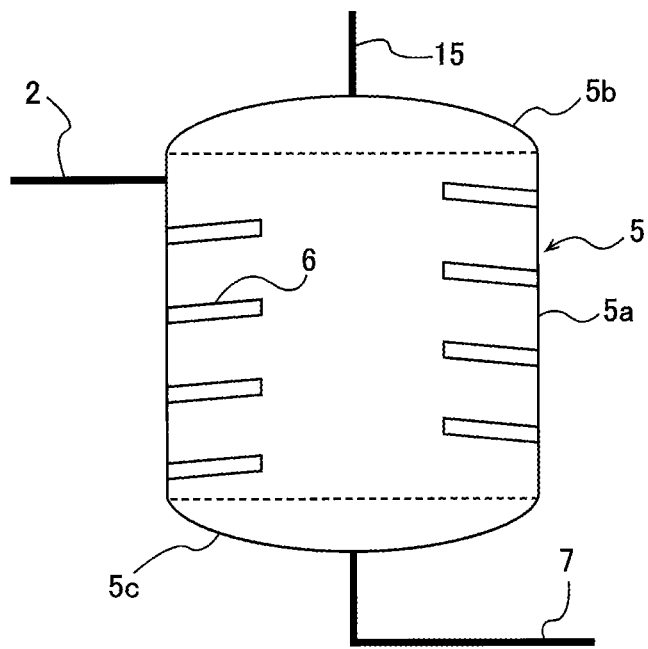
FIG. 12A is a schematic view showing a modified example of the buffer tank.
Figure 12B:
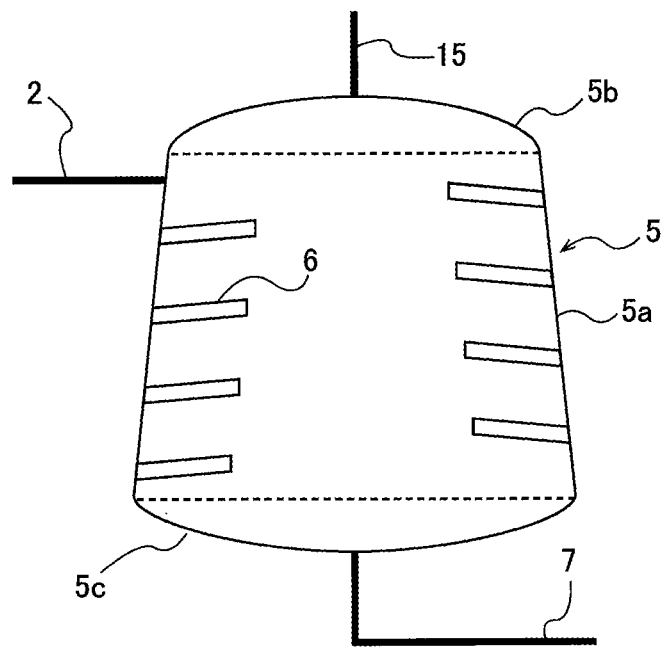
FIG. 12B is a schematic diagram showing another modified example of the buffer tank.

FIG. 12A is a schematic view showing a modified example of the buffer tank 5, and FIG. 12B is a schematic diagram showing another modified example of the buffer tank 5.

The buffer tank 5 shown in FIG. 12A has a guide plate 6 extending along the inner surface of the main body 5a in a spiral form. In order to allow the hydrogen gas contained in the exhaust gas to stay in the upper part of the buffer tank 5, it is important to form the swirling flow of the exhaust gas in the buffer tank 5. Accordingly, as shown in FIG. 12A, the spiral guide plate 6 is provided in the inner surface of the buffer tank 5 to facilitate the formation of swirling flow of the exhaust gas in the buffer tank 5. This configuration effectively prevents the hydrogen gas contained in the exhaust gas from being discharged into the outlet line 7 during the initial exhaust operation.

The main body (cylindrical shaped portion) 5a of the buffer tank 5 shown in FIG. 12B has a truncated cone shape whose diameter gradually increases from a top end toward a bottom end. In addition, the buffer tank 5 has the above-mentioned guide plate 6. When the main body 5a has the truncated cone shape, a distance for the exhaust gas forming the swirling flow to reach the lower end of the buffer tank 5 can be increased. As a result, the hydrogen gas contained in the exhaust gas can be effectively prevented from being discharged into the outlet line 7 during the initial exhaust operation. In one embodiment, the guide plate 6 may be omitted.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. An exhaust system connected to an exhaust line in which an exhaust gas containing a hydrogen gas is flown, comprising:
    an inlet line which is branched from the exhaust line, and in which an inlet valve is disposed;
    a buffer tank which is coupled to the inlet line and has a cylindrical-shaped portion;
    an outlet line which is coupled to a lower part of the buffer tank and in which a first outlet valve is disposed;
    a bypass line which couples the inlet line to the outlet line and in which a bypass valve is disposed;
    a hydrogen-gas discharge line which extends from an upper part of the buffer tank to the bypass line or the outlet line and in which a second outlet valve is disposed;
    a purge line for supplying a purge gas into the buffer tank;
    a dilution gas line which is coupled to the outlet line and in which a dilution-gas introduction valve is disposed; and
    a controller for controlling operations of the inlet valve, the first outlet valve, the second outlet valve, and the dilution-gas introduction valve,
    wherein the inlet line is coupled to an upper part of the cylindrical-shaped portion so as to introduce the exhaust gas toward a tangential direction of the buffer tank,
    the controller is configured to
        perform, when a main valve disposed in the exhaust line is closed, an initial exhaust operation which opens at least the inlet valve and the first outlet valve, and
        perform, after performing the initial exhaust operation for a predetermined time, a hydrogen-gas discharge operation which closes the inlet valve and the first outlet valve, and opens the bypass valve, the second outlet valve, and the dilution-gas introduction valve.

2. The exhaust system according to claim 1, wherein a guide plate extending in a spiral form is disposed in an inner peripheral surface of the buffer tank.

3. The exhaust system according to claim 1, wherein the cylindrical-shaped portion of the buffer tank is formed as a truncated cone shape having a diameter which gradually increases from a top end toward a bottom end thereof.

4. The exhaust system according to claim 1, wherein the controller further opens the dilution-gas introduction valve during the initial exhaust operation.

5. The exhaust system according to claim 1, wherein the exhaust gas is an exhaust gas discharged from EUV exposure equipment.

6. A method of diluting and discharging hydrogen gas, contained in an exhaust gas flowing in an exhaust line in which a main valve is disposed, to a concentration below a lower explosive limit, comprising:
   performing, when the main valve is closed, an initial exhaust operation in which a gas heavier than the hydrogen gas contained in the exhaust gas is discharged from a lower part of a buffer tank while the exhaust gas flowing in the exhaust line is introduced in a tangential direction of the buffer tank to form a swirling flow of the exhaust gas in the buffer tank; and
   performing, after performing the initial exhaust operation for a predetermined time, a hydrogen-gas exhaust operation in which the hydrogen gas is discharged from an upper part of the buffer tank in accordance with a flow rate of purge gas supplied to the buffer tank through a purge gas line.

7. The method according to claim 6, wherein the initial exhaust operation is an operation in which an inlet valve disposed in an inlet line that is branched from the exhaust line, and the first outlet valve disposed in an outlet line that is coupled to a lower part of the buffer tank are opened, and
   the hydrogen-gas exhaust operation is an operation in which the inlet valve and the first outlet valve are closed, and a bypass valve disposed in a bypass line that couples the inlet line to the outlet line, a second outlet valve disposed in a hydrogen-gas discharge line that extends from an upper part of the buffer tank to the bypass line or the outlet line, and a dilution-gas introduction valve disposed in a dilution-gas line which is coupled to the outlet line are opened.

8. The method according to claim 7, wherein the dilution-gas introduction valve is further opened during the initial exhaust operation.

9. The method according to claim 6, wherein the exhaust gas is an exhaust gas discharged from EUV exposure equipment.

\* \* \* \* \*